(12) United States Patent
Frei

(10) Patent No.: US 8,872,567 B2
(45) Date of Patent: Oct. 28, 2014

(54) HIGH SPEED PULSE SHAPING TECHNOLOGY

(76) Inventor: Matthias Frei, Manukau (NZ)

(*) Notice: Subject to any disclaimer, the term of this patent is extended or adjusted under 35 U.S.C. 154(b) by 0 days.

(21) Appl. No.: 13/811,168

(22) PCT Filed: Jul. 21, 2011

(86) PCT No.: PCT/NZ2011/000141
§ 371 (c)(1),
(2), (4) Date: Mar. 28, 2013

(87) PCT Pub. No.: WO2012/011824
PCT Pub. Date: Jan. 26, 2012

(65) Prior Publication Data
US 2013/0222034 A1  Aug. 29, 2013

Related U.S. Application Data

(60) Provisional application No. 61/366,299, filed on Jul. 21, 2010.

(51) Int. Cl.
| H03K 3/013 | (2006.01) |
| H03K 3/02 | (2006.01) |
| G01S 7/282 | (2006.01) |
| G06F 1/02 | (2006.01) |
| G11B 20/10 | (2006.01) |
| H03C 1/00 | (2006.01) |

(52) U.S. Cl.
CPC .. *H03K 3/02* (2013.01); *H03C 1/00* (2013.01); *G01S 7/282* (2013.01); *G06F 1/02* (2013.01); *G11B 20/10037* (2013.01); *G11B 2220/2516* (2013.01)

USPC .......................................... 327/299; 327/148

(58) Field of Classification Search
CPC ........ H03C 1/00; H04L 27/2614; H03M 1/66
USPC ....................................... 327/147, 148, 299
See application file for complete search history.

(56) References Cited

U.S. PATENT DOCUMENTS

| 4,818,996 | A | 4/1989 | Kimura |
| 6,421,390 | B1 | 7/2002 | Burkhart |
| 7,126,521 | B2 * | 10/2006 | Barcelona ..................... 341/155 |
| 7,498,964 | B1 * | 3/2009 | Beyerle ........................ 341/132 |
| 7,821,432 | B2 * | 10/2010 | Asami et al. ................. 341/118 |
| 8,115,519 | B2 * | 2/2012 | Turner .......................... 327/105 |
| 8,116,387 | B2 * | 2/2012 | Rofougaran .................. 375/259 |
| 8,581,756 | B1 * | 11/2013 | Duewer et al. ................. 341/61 |
| 2001/0035994 | A1 | 11/2001 | Agazzi et al. |
| 2009/0154442 | A1 | 6/2009 | Kang et al. |
| 2011/0188604 | A1 * | 8/2011 | Wagner ........................ 375/302 |

OTHER PUBLICATIONS

International Search Report, International Patent Application No. PCT/NZ2011/000141, mailed on Sep. 23, 2001, six pages.

* cited by examiner

*Primary Examiner* — Thomas J Hiltunen
(74) *Attorney, Agent, or Firm* — Lewis, Rice & Fingersh, L.C

(57) ABSTRACT

A circuit adapted to generate a high speed shaped pulse comprising an input adapted to receive a data signal and a control signal. A plurality of logic elements are configures to receive the data signal and the control signal and generate a plurality of output signals representative of the shaped pulse. A digital to analog converter is adapted to receive the plurality of output signals and generate a shaped pulse.

20 Claims, 8 Drawing Sheets

HIGH SPEED PULSE SHAPING TECHNOLOGY

CROSS REFERENCE TO RELATED APPLICATION(S)

This application is a §371 U.S. National Phase of International Application Serial No.: PCT/NZ2011/000141 filed Jul. 7, 2011, which in turn claims the benefit of U.S. Provisional Patent Application Ser. No. 61/366,299, filed Jul. 21, 2010. The entire disclosure of all the above documents is herein incorporated by reference.

FIELD OF THE INVENTION

The invention broadly relates to an improvement in high-speed pulse shaping technology, and in particular to hardware for controlling the generation of desirably shaped pulses especially for pulse widths as short as 100 ps.

SUMMARY OF THE PRIOR ART

For decades, digital signal processing, generation and transmission has replaced analog signal processing and transmission. Recently, the clock rates of high-performance digital circuits increased dramatically from speeds of 40 GHz to above 100 GHz. At such high clock speeds many digital applications require ideally shaped pulses to operate at their best.

In the prior art, efforts to generate a rectangular pulse shape often results in unwanted overshooting and undershooting effects. Further, angular edges on pulses result in excessive harmonic components being generated that contribute to increased system noise.

Some effort has been made to shape a pulse to reduce the unwanted harmonic content in a pulse. Pulse shaping has been implemented with passive analog circuits consisting of a combination of resistors, capacitors and inductors. However, these implementations provide no means of shaping the pulse. Further, they provide no flexibility to change the of the shape pulse in real-time, instead requiring physical elements to be changed within the circuit.

SUMMARY OF THE INVENTION

It is therefore an object of the present invention to provide an improved system for the efficient generation of pulses in the 100 ps region, or at least provide the industry with a useful choice.

In one aspect the present invention may be said to consist in an integrated circuit for the generation of shaped pulses comprising:
an input adapted to receive a data signal, the data signal represented by a plurality of pulses each having a pulse duration,
an input adapted to receive a control signal, the control signal representing a list of desired pulse amplitudes for a plurality of pulse duration segments,
a clock input adapted to receive a clock signal,
a plurality of logic elements configured to receive each of said control signal and data signal and generate a plurality of output signals that represent a desired pulse shape,
a digital to analog converter adapted to receive the plurality of output signals and generate a desired pulse shape when a clock signal is received by the clock input.

Preferably the control signal represents a selection from a greater range of desired pulse amplitudes.

Preferably the output of the digital to analog converter is connected to an amplifier.

Preferably the output of the amplifier is connected to a device under test.

Preferably the output of the amplifier is connected to a writing head of a hard drive disc.

referably the output of the amplifier is connected to a radar antenna.

Preferably the output of the amplifier is connected to a transmission device.

Preferably the plurality of logic elements comprises a plurality of logic gates and delay elements.

Preferably each of the pulse durations represents segments of a clock period.

Preferably the desired pulse shape is optimised to reduce noise in a device under test.

In another aspect the invention is broadly said to consist in a method of producing a shaped pulse from a digital pulse according to the steps of:
receiving a data signal at a data signal input, the data signal having a plurality of pulses each having a pulse duration,
receiving a control signal at a control input, the control signal representing a list of desired of pulse amplitudes for a plurality of pulse duration segments,
receiving a clock signal at a clock input,
configuring a plurality of logic elements to receive each of said control signal and data signal and generate a plurality of output signals that represent a desired pulse shape,
providing the clock signal and the receive the plurality of output signals to the digital to
analog converter to thereby generate a desired pulse shape.

Preferably the control signal represents a selection from a greater range of desired pulse amplitudes.

Preferably the method further includes the step of providing the output of the digital to analog converter to an amplifier.

Preferably the method further includes the step of providing the output of the amplifier a device under test.

Preferably the method further includes the step of providing the output of the amplifier to a writing head of a hard drive disc.

Preferably the method further includes the step of providing the output of the amplifier to a radar antenna.

Preferably the method further includes the step of providing the output of the amplifier to a transmission device.

In another aspect the invention is broadly said to consist in a method of configuring a controller to perform the steps of
receive a data signal at a data input, the data signal represented by a plurality of pulses each having a pulse duration,
receive a control signal at a control input, the control signal representing a list of desired of pulse amplitudes for a plurality of pulse duration segments,
receive a clock signal at a clock input,
provide a plurality of logic elements configured to receive each of said control signal and data signal and generate a plurality of output signals that represent a desired pulse shape,
provide a digital to analog converter adapted to receive the plurality of output signals and
generate a desired pulse shape when a clock signal is received by the clock input.

In another aspect the invention is broadly said to consist in a method of generating a list of desired pulse characteristics comprising:
calculating a desired pulse shape,
calculating a desired pulse duration, determining a plurality of temporal positions within the pulse duration, determining the amplitude of the desired pulse at each of the plurality of temporal positions, compiling a list of amplitudes for each of the temporal positions.

Preferably the list is provided to a digital to analog converter.

Preferably the digital to analog converter outputs a desired pulse, according to the list, when a clock input is received.

In another aspect the invention is broadly said to consist in a circuit adapted to generate a high speed shaped pulse comprising a data signal input, a control signal input representative of pulse amplitudes with the pulse, a plurality of logic elements configured to receive said data signal and said control signal and generate a plurality of output signals representative of said shaped pulse, and a digital to analog converter adapted to receive the plurality of output signals and generate a shaped pulse.

Preferably the circuit further comprises a clock input, said a digital to analog converter generating a shaped pulse when a clock signal is received.

Preferably the plurality of logic elements configured to receive said data signal and said control signal comprises a plurality of delay elements, a plurality of switchable connectors and a plurality of flip flops.

Preferably the delay elements are configured to receive a clock signal from said clock input where each delay element is adapted to provide, as an output, a secondary clock signal each delayed, by a differing amount, from the clock signal.

Preferably the secondary clock signals are received by said plurality of switchable connectors, said control input is adapted to configure said switchable connectors to selectively connect said secondary clocking signals to said flip flips.

Preferably the data signal is represented by a plurality of pulses each having defined pulse duration.

Preferably the pulse duration is approximately 100 ps.

Preferably the control signal input is representative of the pulse amplitude at particular steps within the duration of said pulse.

Preferably the plurality of output signals are generated based the control signal input.

Preferably the control signal input is representative of at least three pulse amplitudes for at least three steps within the duration of said pulse.

Preferably the control signal is representative of desired knee points of said shaped pulse.

Preferably the control signal is determined by interpretation of the shaped pulse as applied to the load, the interpretation comprising determination of the efficiency of the shaped pulse as applied to the load.

Preferably the shaped pulse is of a reduced noise pulse shape.

Preferably the data signal is a digital data stream.

Preferably the digital to analog converter is adapted to operate at a speed of at least three samples per width of the desired shaped pulse duration.

Preferably the circuit is implemented by a field programmable gate array or application specific integrated circuit.

Preferably the output of the digital to analog converter is adapted to connect to an amplifier.

Preferably the output of the amplifier is adapted to connect to a writing head of a hard drive disc.

Preferably the output of the amplifier is adapted to connect to a device under test.

Preferably the output of the amplifier is adapted to connect to a radar antenna.

Preferably the output of the amplifier is connected to a transmission device.

In another aspect the invention is broadly said to consist in a method of configuring a circuit to generate a shaped pulse from a data signal comprising adapting an input to receive a data signal, adapting an input to receive a control signal, configuring a plurality of logic elements to receive said data signal and said control signal and generate a plurality of output signals representative of said shaped pulse, and adapting a digital to analog converter to receive the plurality of output signals and generate a shaped pulse.

Preferably the method further comprises receiving a clock signal, said a digital to analog converter generating a shaped pulse when a clock signal is received.

Preferably said logic elements comprises a plurality of delay elements, a plurality of switchable connectors and a plurality of flip flops.

Preferably the delay elements are configured to receive a clock signal from said clock input where each delay element is adapted to provide, as an output, a secondary clock signal each delayed, by a differing amount, from the clock signal.

Preferably the secondary clock signals are received by said plurality of switchable connectors, said control input is adapted to configure said switchable connectors to selectively connect said secondary clocking signals to said flip flips.

Preferably the data signal is represented by a plurality of pulses each having defined pulse duration.

Preferably the pulse duration is approximately 100 ps.

Preferably the control signal is representative of a list of parameters.

Preferably the plurality of output signals are generated based on said list of parameters.

Preferably the list of parameters is representative of at least three pulse amplitudes for at least three steps within the duration of the shaped pulse.

Preferably the control signal is representative of desired knee points of the shaped pulse.

Preferably the control signal is determined by interpretation of the shaped pulse as applied to the load, the interpretation comprising determination of the efficiency of the shaped pulse as applied to the load.

Preferably the shaped pulse is of a desired pulse shape such that it provides reduced noise and increased efficiency in the load.

Preferably the data signal is a digital data stream.

Preferably the digital to analog converter is adapted to operate at a speed of at least three samples per width of the desired shaped pulse duration.

Preferably the integrated circuit is implemented by a field programmable gate array or application specific integrated circuit.

Preferably the output of the digital to analog converter is adapted to connect to an amplifier.

Preferably the output of the amplifier is adapted to connect to a writing head of a hard drive disc.

Preferably the output of the amplifier is adapted to connect to a device under test.

Preferably the output of the amplifier is adapted to connect to a radar antenna.

Preferably the output of the amplifier is connected to a transmission device.

In another aspect the invention is broadly said to consist in a method of generating a list of desired pulse characteristics comprising calculating a desired pulse shape, calculating a desired pulse duration, determining a plurality of steps within the pulse duration, determining the amplitude of the desired pulse shape at each of the plurality of the steps, compiling a list of amplitudes for each of the steps.

Preferably said method comprises determining at least three steps within said pulse.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

BRIEF DESCRIPTION OF THE DRAWINGS

Preferred forms of the invention will now be described with reference to the accompanying drawings in which.

DETAILED DESCRIPTION

The invention relates to a method and apparatus that may be applied to high speed applications that would benefit from shaping the slopes of very high speed pulses. The pulses herein referred to in this specification are most preferably very high speed pulses. That is, pulses in the region of 100 ps in duration. By controlling the shape of a high speed pulse, less generation of harmonic spectral noise occurs which thereby reduces the noise generated in a system. The invention is preferably implemented using a control system such as a microprocessor, field programmable gate array or other similar device having a configurable circuit or capability of being configured to provide the function of logic elements.

Digital-to-Analog Converters (DACs) are used to convert digital data into analog signals. High speed DACs allow the generation of arbitrary waveforms within the pulse width required by a digital signal application.

Figure 1:
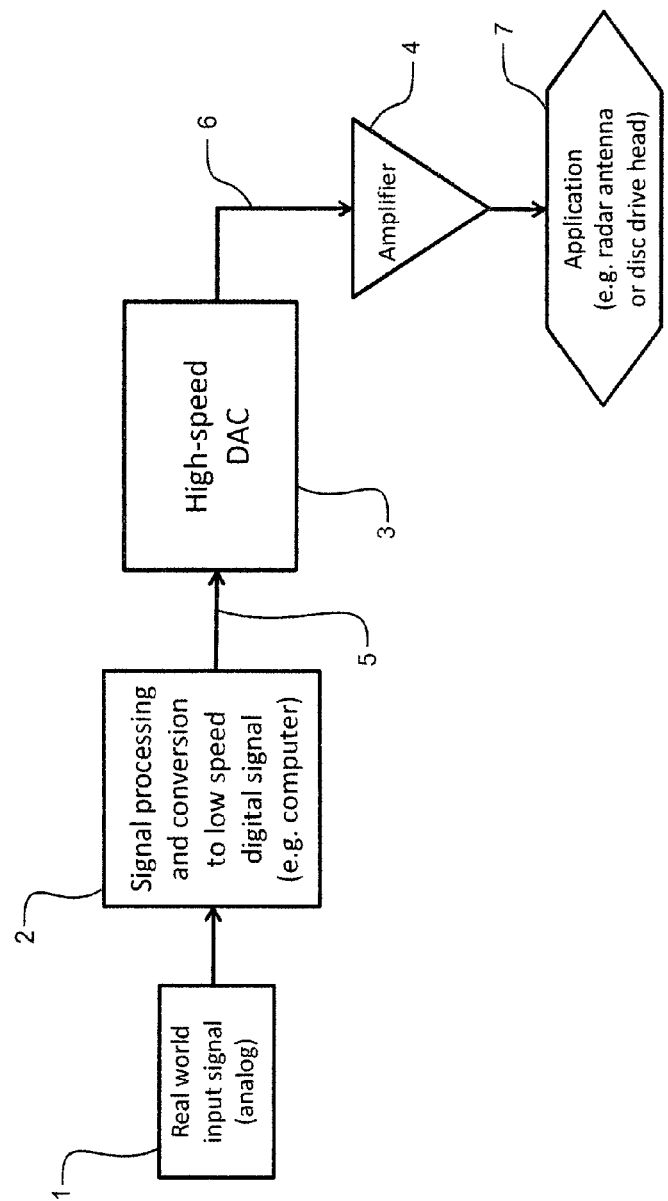
FIG. 1 illustrates an application of pulse shaping technology to a system.

FIG. 1 shows an example system illustrating the preferred arrangement of components that allows a digital data stream to be converted into a pulse shaped to a desired form. An analog signal 1 is input an Analog to Digital converter (ADC) 2. The ADC may also include a signal filter to prepare the incoming signal 1 for conversion. The digital signal may then be subject to computational processing. A signal 5, such as a digital signal, is output by the ADC or computational processor and provided to a DAC 3 for conversion back to an analog signal 6. Preferably the signal output from the DAC 3 is an analog signal representing the shaped pulse, having multiple bits of resolution at a speed in the Gb/s range, firing a sampling point in the ps range. The analog signal is typically amplified by a suitable amplifier 4 to thereby drive an application device 7. Such application devices include, but are not limited to:

automated test equipment, where pulses are applied to a Device under Test (DUT), optical fiber transmission, where light pulses are shaped to correct for optical distortion effects that occur when pulses propagate in an optical fibre, magnetic recording applications, where avoiding rectangular pulse transitions in a writing pulse results in a possible higher recording density, and digital Phase-Array Broadband Radar systems.

In the preferred embodiment of the invention, the pulses in a digital system are shaped by a very high-speed DAC. Preferably the DAC operates at a sampling rate of at least three samples per pulse width. Ideally, many more samples per pulse width are used to thereby increase the resolution of the output pulse shape.

FIG. 2 illustrates pulse shapes formed by the use of three and four sampling points for a given pulse width. A data signal stream is produced by a digital data source and typically consists of a series of rectangular waveforms 40. Using such waveforms directly with a hardware application may cause the aforementioned problems associated harmonic generation and noise. The generic waveform 40 is preferably transformed into a shaped pulse 41. The particular profile of the shaped pulse 41 is determined to provide reduced system noise and increased system efficiency.

Figure 2A:
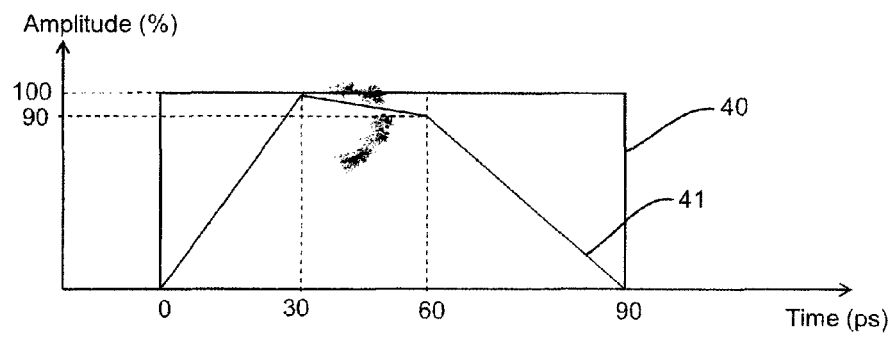
FIGS. 2a and 2b illustrate pulse shapes formed by the use of two and three sampling points for a given pulse width.
Figure 2B:
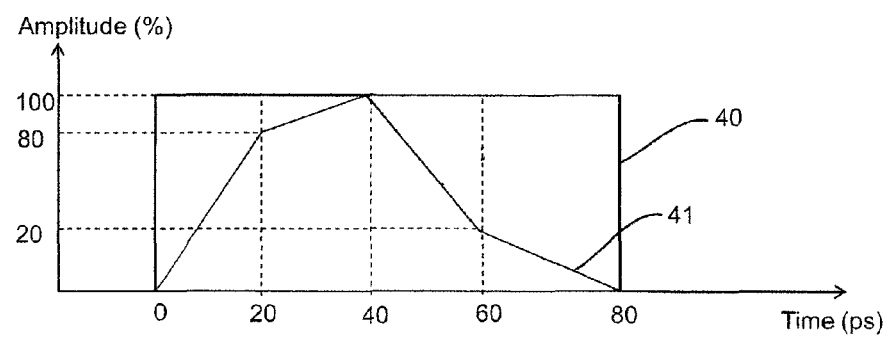

In FIG. 2(a), a shaped pulse is provided by configuring three knee points. In FIG. 2(b), a pulse is shaped by configuring four knee points. The addition of further sampling points at steps within the duration of the shaped pulse provides further resolution and control of the resultant shape.

Knowledge of the analog transmission behaviour of the circuit through which the signal travels can be used to optimize the wanted effect of the signal. That is, where a pulse distorts as it is transmitted through a circuit or related electrical application, a preconceived pulse shape can be determined to input to the circuit such that a desired pulse shape occurs at the output of the circuit. Distortion-free pulse transmission can therefore be realised. Such applications for distortion free pulse transmission include where electrical pulses are converted into radio waves, where electrical pulses are converted into magnetic fields magnetic fields, where electrical pulses are converted into optical signals, and the like.

The process of determining the ideal pulse shape may differ for different applications. For example in an ATE (automated test equipment) application, a triangular pulse is used to drive a DUT (device under test) to test whether the device functions as desired. For transmission via optical fibre, the ideal pulse shape may be determined by calculating an inverse transformation of the pulse distortion experienced by a rectangular pulse during transmission.

Figure 3:
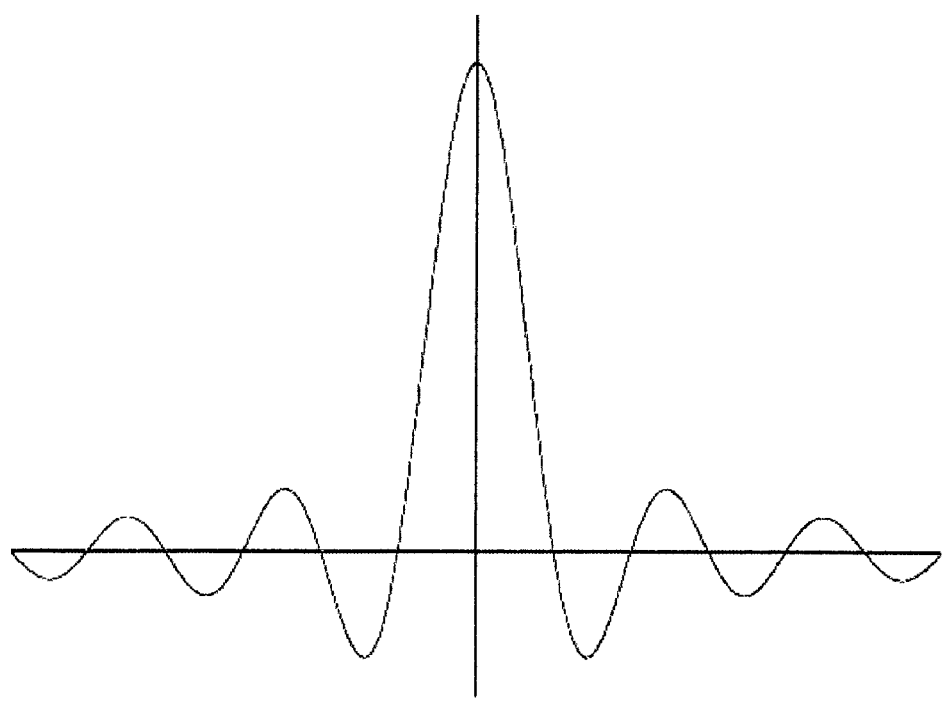
FIG. 3 illustrates the spectrum of a rectangular pulse.

FIG. 3 represents the spectrum of a rectangular pulse. The maxima on the right and left from the main lobe in the centre represent the energy of the pulse which may be lost during signal transmission. A shaped pulse has less maxima which indicates less energy loss during signal transmission therefore is more energy efficient.

To find the pulse ideal shape for a specific application, the pulse shape may be calculated using a mathematical model of the circuit or by simulation of the circuit. The ideal pulse shape is then transformed into a digital sampling description to thereby drive the inputs of the high-speed DAC. According to a preferred embodiment, the solution is transformed into a sampling description having a list of pulse heights at particular sampling points or percentages of the total pulse width. For example, for a pulse having 100 ps duration and seven sampling points, the list of seven steps through the pulse duration and associated percentage of amplitude at each step could be: 0 ps, 0%; 15 ps, 10%; 30 ps, 50%; 50 ps, 100%; 70 ps, 40%; 90 ps, 10%; 100 ps, 0%.

It should be noted that any number of sampling points may be used, but most preferably there should be at least three sampling points to provide adequate pulse shaping ability or resolution. For example, for a pulse of 100 ps duration having three sampling points a first step may be located anywhere within 0 to 95 ps, the second step located anywhere between 5 ps to 95 ps, and a third step located anywhere between 5 ps and 100 ps, where any desired pulse height may be specified for those steps. However, in another embodiment, the sampling points may be located at a percentage of the total pulse duration. For example, for a pulse of 100 ps duration having at least three sampling points having three sampling points a first step may be located anywhere within 0% to 98%, the second step located anywhere between 2% to 98%, and a third step located anywhere between 2% and 98%, where any desired pulse height may be specified for those steps.

Further, the shaped pulse widths referred to within the specification are determined to be 100 ps, or approximately 100 ps, and/or in the same order of magnitude as 100 ps, and/or of a similar order of magnitude as 100 ps. It should be further noted that those skilled in the art will realise that where pulse durations of 100 ps are referred to, this implies the general operating speed of the devices referred to within this specification, as the general operating speed infers the technical issues that are often unique to such speeds, or such a range of speeds or pulse durations when compared to speeds or pulse durations lower or higher than such that other technical issues become significant.

In practice, the list is transformed into a program using a hardware description language (e.g. VHDL) and loaded into a device such as a Field Programmable Gate Array (FPGA). The pulse shape can therefore be changed dynamically by changing the parameters in the list and generating a new FPGA program accordingly. The control inputs may optionally be read by the FPGA program and further used to influence the pulse shape dynamically.

Figure 4:
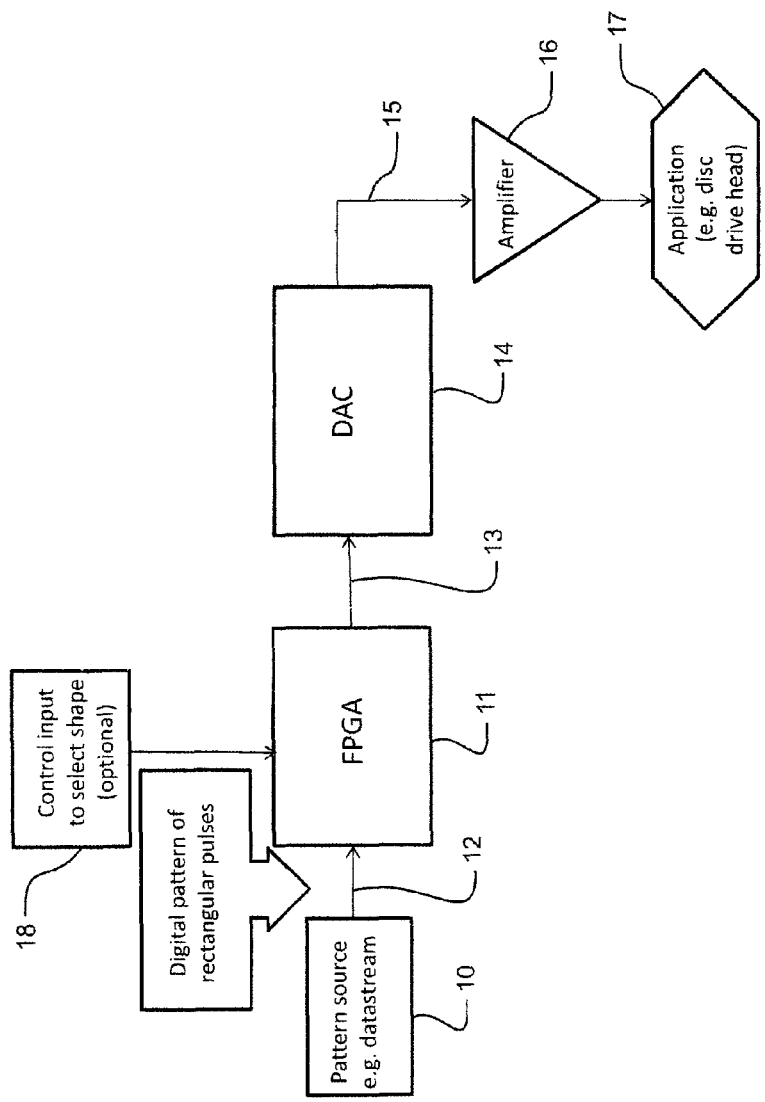
FIG. 4 illustrates a hardware block configuration for a pulse pattern source, field programmable gate array, digital to analog converter, and an amplifier.

FIG. 4 illustrates a pulse shaping system using a very high-speed DAC having a sampling rate of three or more samples per pulse width. As shown in FIG. 2, having at least three sampling points guarantees that at least a trapezoidal pulse shape can be generated. A hardware block configuration for a pulse pattern source 10 provides a signal to a field programmable gate array 11 via an appropriate connection 12. Preferably the pulse pattern is a digital data stream, but may be any other alternative form of data stream such as a multi spectral or multi level signal. The FPGA 11 configuration is generally specified using a hardware description language. The FPGA typically operates by reading input values, processing those values together with internally stored values generated during programming or earlier processing, and producing new values to be further stored or written to output devices in order to control some process or machinery. Preferably the output from the FPGA 11 has multiple lanes of data, such as an FPGA rocket I/O interface, to deliver a pattern for digital conversion. A digital to analog converter 14 receives the output signal from the FPGA 11 via connection 13 and outputs an analog signal 15 to an amplifier 16. Preferably the signal output from the DAC 14 is an analog signal representing the shaped pulse, having multiple bits of resolution at a speed in the Gb/s range, firing a sampling point in the ps speed range. The amplifier 16 provides the shaped pulse at a voltage level suitable for driving a particular end application 17.

In the preferred embodiment, further integration of the system into an application specific single chip (ASIC) is implemented. An ASIC generally provides a circuit that is customised to provide a specific solution. According to an embodiment of the preferred invention, the following process steps are used to configure an ASIC.

First, a desired input waveform or pulse shape is established. The profile of the shaped pulse is preferably specified for a particular end application and will vary depending on the applications sensitivity to noise and the transmission pulse rate or bandwidth required. Next, a model of the circuit required to generate the input waveform to the DAC is designed. The input waveform to the DAC is used to generate and modify the pulse shape. The input waveform consists of a list of parameters that is representative of pulse amplitude for steps within the duration of the pulse. Next, a logic circuit is constructed consisting of logic gates and delay elements and connected to the DAC. The logic gates and delay elements constitute a pattern generator. The combination of the pattern generator connected to the DAC provides an output pulse generator. The pattern generator is preferably constructed within an integrated circuit.

Preferably the list of parameters, that define the profile of the shaped pulse, can be defined offline, described in VHDL and downloaded into the FPGA 11 as desired. Once the list has been loaded into the FPGA, the DAC 14 can generate the shaped pulse once or repeat it a number of times, or generate it as stimulated by the pattern source.

To operate the pattern generator, an input is provided from a data source which is typically represented by a rectangular bi-level pulse source such as a digital data stream. The pattern generator receives the data stream and drives the DAC with a series of signals or pattern that represents the shaped pulse desired for the particular end application. A standard rectangular input data stream is thereby transformed into a corresponding series of shaped pulses.

Figure 5:
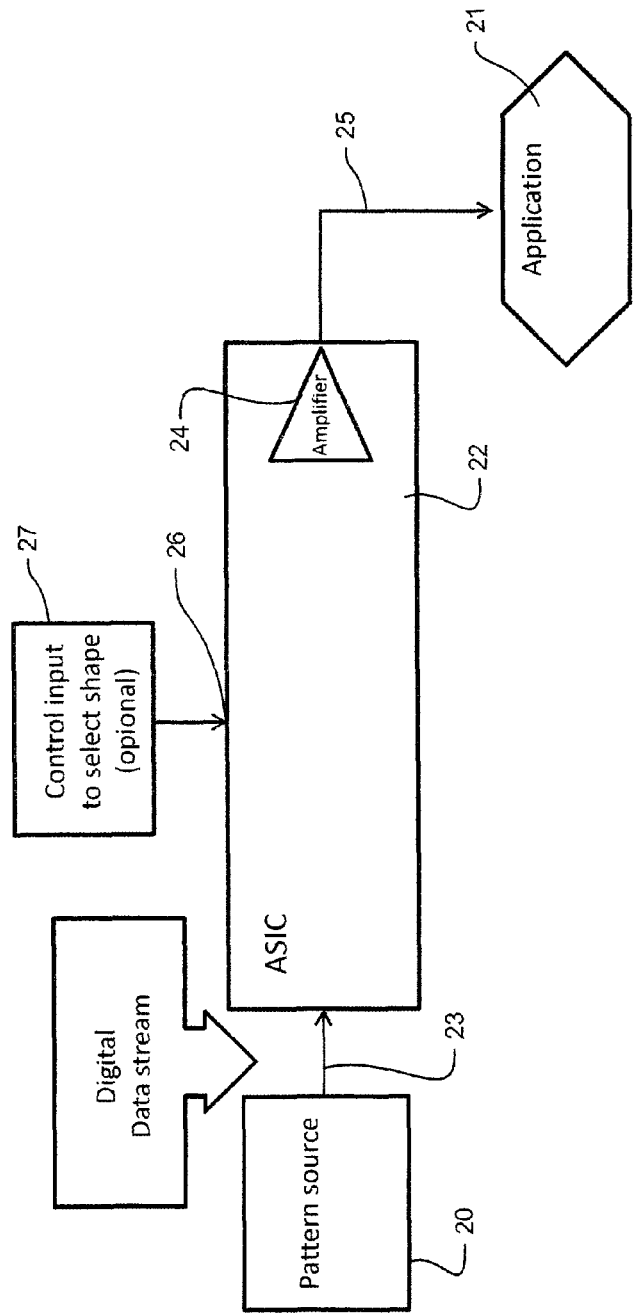
FIG. 5 illustrates a hardware block configuration having pulse shaping ability in a single-chip arrangement.

FIG. 5 illustrates a hardware block configuration having pulse shaping ability including an ASIC configured according to the above. A pattern source 20 provides the stream of pulses to be applied to the end application 21, that is, the data stream. The digital data stream of the pattern source 20 is provided to the ASIC 22 via an appropriate connection 23. The ASIC 22 is configured to shape the incoming pulses into the predetermined pulse shape that is optimised to the application 21. The pulse shaping is preferably controlled by a separate input to the ASIC 26 and consists of a selection from a list of preconfigured pulse heights at particular sampling points at steps within the application shaped pulse duration. The control input 26 can be used to provide new desired pulse shape characteristics from an external source 27. The external source is optionally an independent controller, but may also be a feedback mechanism that interprets the pulses output to the application 21 and determines where further optimisation may occur by a feedback process integral to the configured circuit, or by an external such as measurement or modelling by some third party. An amplifier 24 is optionally provided by the ASIC 22 to provide an output voltage to best suit the application 21. The resulting optimised shaped pulse is provided to the application 21 by an appropriate electrical connection 25. Preferably the shaped pulses generated according to the input data stream 20 have a defined bit resolution at a Giga samples per second speed range.

During operation of the ASIC 22, the datastream input 23 triggers a series of fast pulses at the inputs of the DAC within the period of each clock cycle. The inputs to the DAC are stimulated according to the list of pulse heights that produce the desired pulse shape for the application. The output of the DAC drives the input stage of an amplifier 24, which in turn generates the high powered shaped pulse at the output of the ASIC. The control input is preferably predefined for a specific application. Alternatively, the control input is user definable such that the pulse shape can be refined. Such refinement typically would occur during testing of an end application and may involve, for example, changes to the pulse shape to increase the speed at which data can be written onto a plate of a memory disc. Another purpose of the control input is the use of the same ASIC for different applications which require different pulse shapes.

Figure 6:
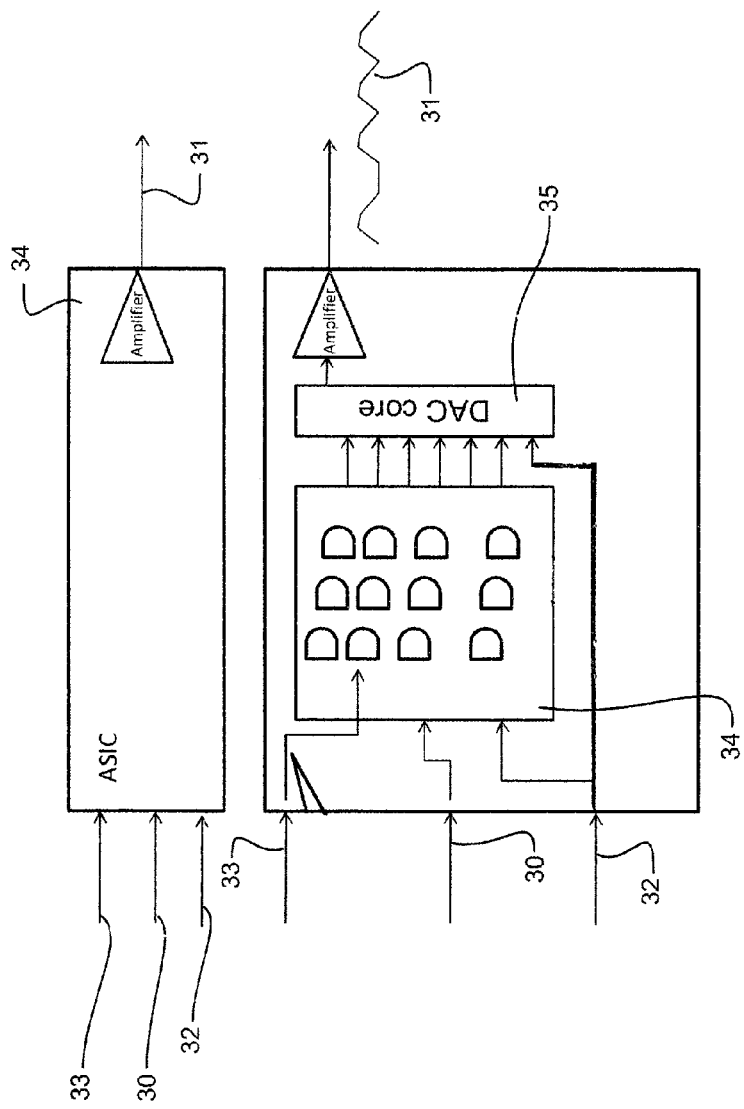
FIG. 6 illustrates a hardware block diagram of pulse shaping chip (upper Figure) and element structure inside pulse shaping in a single-chip arrangement (lower Figure).

FIG. 6 illustrates a hardware block diagram of the preferred embodiment of the invention. The upper Figure shows the ASIC as a control block having a control signal input 33, a data input 30 and a clock 32. It should be noted that the clock input may be external to the ASIC, or the ASIC may generate a clock signal internally. Similarly, where a device other than an ASIC is used, the clock may be provided by an external source and input to the device, or the device may generate a clock source internally. The control block 34 processes the signals received by the data input 30 and outputs the same data according to a preferred pulse shape at the output 31. The lower figure shows the structure of the logic gates and delay elements inside pulse shaping arrangement. The control input 33 signals the control block 34 to signal the DAC 35 with a number of signals representing a desired pulse shape. The control input is used to switch between different configurations of delay and trigger blocks to thereby control the profile of the shaped pulse. Data received at the data input 30 is reconstructed at the output 31 as a defined shaped pulse.

Figure 7A:
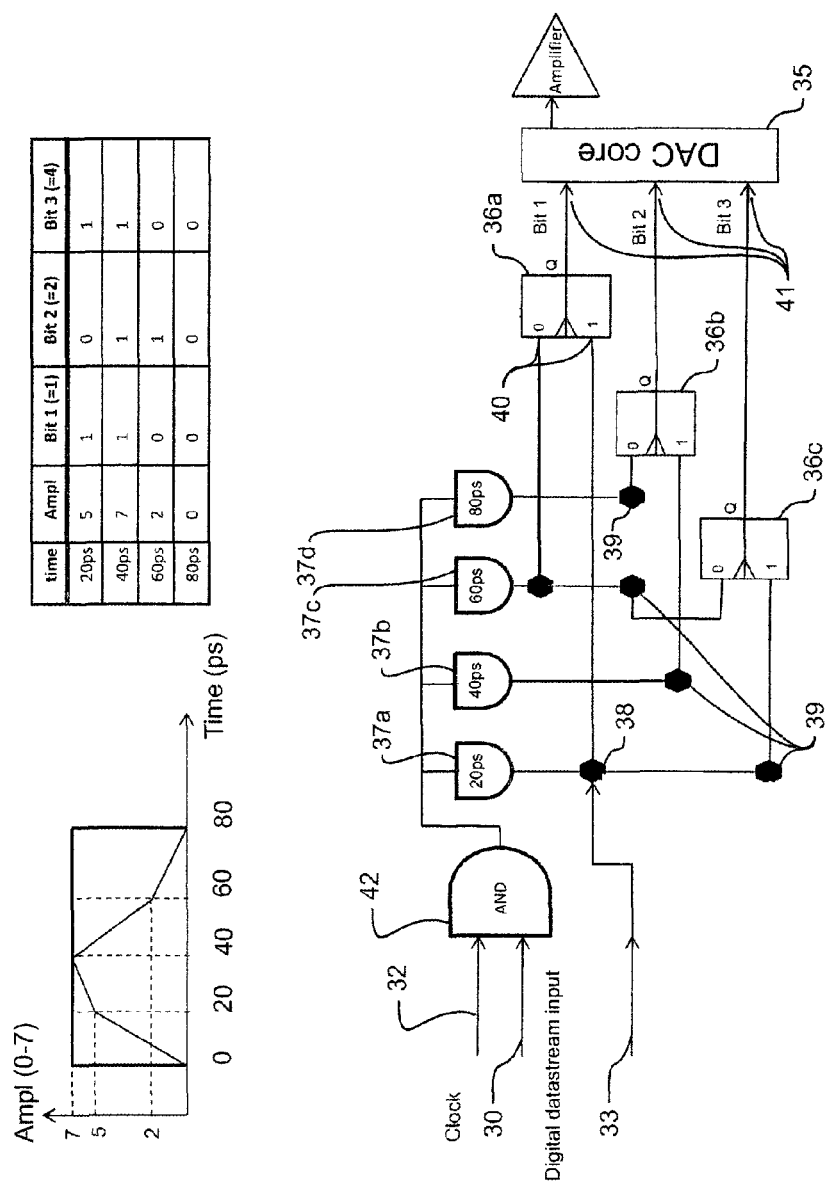
FIGS. 7a and 7b illustrate delay lines and trigger logic within an ASIC block.
Figure 7B:
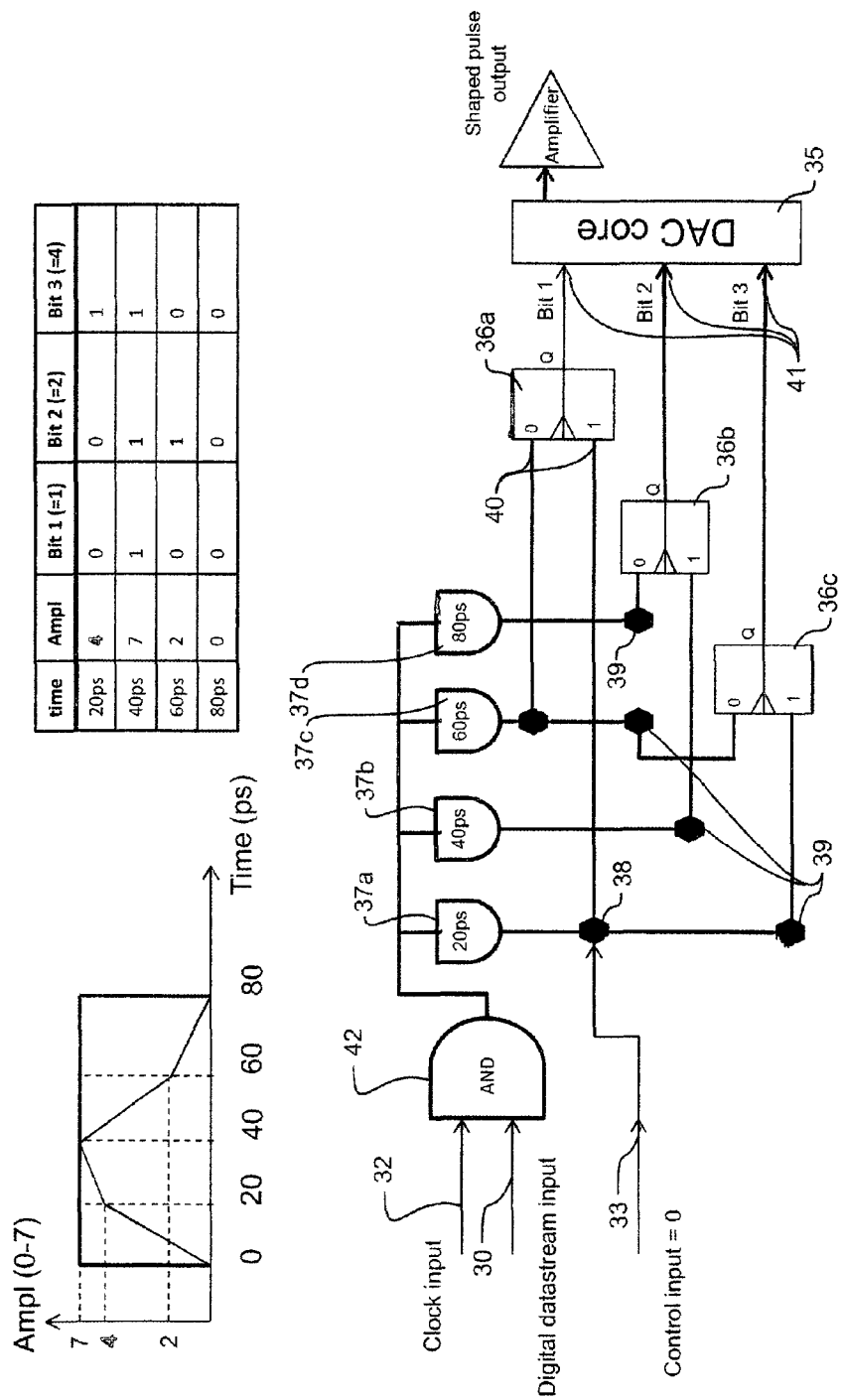

FIGS. 7a and 7b are examples of details of delay lines and trigger logic within the ASIC block 34 as seen in FIGS. 5 and 6. An AND logic gate 42 is arranged to combine the clock input 32 and digital data stream input 30 to generate a shaped pulse when the data input 30 is '1'. Control input 33 may be connected to a switchable connector 38 to selectively connect the delay elements 37a-37d, in the example shown through delay stages that provide 20 ps, 40 ps, 60 ps, and 80 ps respectively, to the input of D-FlipFlops 36a. Connectors 39 are also used to connect delay elements 37a-37d to inputs of D-FlipFlops 36a-36c to achieve the desired switching behaviour of DAC inputs 41. Each delay element 37 generates a slope which triggers the '0' or the '1' input of a D-FlipFlop 36 during the corresponding sampling period. The output of each D-FlipFlop 36 may be determined by either of the input which is triggered by the delay element. The output of each D-FlipFlop 36 is connected to its corresponding input of the DAC core 35. FIG. 7a shows the circuit with the control input 33 set to '1' and FIG. 7b with the control input set to '0' which will turn off the switchable connector 38 and result in a different shaped pulse as seen in FIG. 7a. In FIG. 7b the control input 33 has 1-bit width and a shaped pulse consists of four sampling periods. However a control input may have a plurality of bits and a different number of delay elements may be selected to achieve the desired switching behaviour of DAC inputs 41.

The invention can for example be applied to drive the magnetic head of a hard disk as follows: In principle, a hard disk writing head moves above disk platter and transform platter's magnetic field into electrical current when reading the disk, and transform electrical current into magnetic field when writing the disk. In the writing process, data is stored digitally on the disk as tiny magnetised regions, where a magnetic orientation in one direction represents a "1" and opposite orientation represents a "0". When a hard disk magnetic writing head is driven by rectangular pulses, each change of slope in the pulses results an overshooting or undershooting in the pulse amplitude. The overshooting represents energy inefficiency as the excess energy is not utilized in the writing process and it also disturbs regions nearby the writing head on the platter. When undershooting occurs, the applied magnetic field may not be sufficient to polarise the magnetic elements on the platter of the hard disk. Therefore the pulses must be longer to compensate for the time lost in the undershooting periods. This reduces the overall possible minimum pulse width and the maximum possible capacity of the hard disk. An ideally shaped pulse has no overshooting and the slopes have a controlled angle which follows the capability of the magnetic regions to ideally absorb the applied magnetic energy into magnetic polarisation. Therefore, the speed and density of a hard disk may be optimised by applying ideally shaped pulses instead of rectangular pulses.

Advantageously, a chip can be manufactured to contain only the control block, DAC and an amplifier to produce a desired ASIC. Features such as input interfaces can be entirely omitted thus reducing design and manufacturing costs. The ASIC can be used in any device or product that requires the shaping of pulses that are generated by any pattern source.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

The invention claimed is:

1. A circuit adapted to generate a high speed shaped pulse comprising:
    a data signal input,
    a control signal input representative of pulse amplitudes with the pulse,
    a plurality of logic elements configured to receive said data signal and said control signal and generate a plurality of output signals representative of said shaped pulse, and
    a digital to analog converter adapted to receive said plurality of output signals and generate a shaped pulse;
    wherein said plurality of logic elements comprise a plurality of delay elements, a plurality of switchable connectors, and a plurality of flip flops.

2. The circuit of claim 1, further comprising a clock input, said a digital to analog converter generating a shaped pulse when a clock signal is received.

3. The circuit of claim 1, wherein the delay elements are configured to receive a clock signal from said clock input where each delay element is adapted to provide, as an output, a secondary clock signal each delayed, by a differing amount, from the clock signal.

4. The circuit of claim 3, wherein the secondary clock signals are received by said plurality of switchable connectors, said control input is adapted to configure said switchable connectors to selectively connect said secondary clocking signals to said flip flips.

5. The circuit of claim 1, wherein the data signal is represented by a plurality of pulses each having a pulse duration of approximately 100 ps.

6. The circuit of claim 1, wherein the control signal input is representative of the pulse amplitude at particular steps within the duration of said pulse.

7. The circuit of claim 1, wherein the plurality of output signals are generated based the control signal input.

8. The circuit of claim 1, wherein the control signal input is representative of at least three pulse amplitudes for at least three steps within the duration of said pulse.

9. The circuit of claim 1, wherein the control signal is representative of desired knee points of said shaped pulse.

10. The circuit of claim 1, wherein the control signal is deteitnined by interpretation of the shaped pulse as applied to the load, the interpretation comprising determination of the efficiency of the shaped pulse as applied to the load.

11. The circuit of claim 1, wherein the digital to analog converter is adapted to operate at a speed of at least three samples per width of the desired shaped pulse duration.

12. The circuit of claim 1, wherein the output of the digital to analog converter is adapted to connect to any one of:
an amplifier;
a hard drive disc;
a device under test;
a radar antenna; or
a transmission device.

13. A circuit adapted to generate a high speed shaped pulse comprising:
a data signal input,
a control signal input representative of pulse amplitudes with the pulse,
a plurality of logic elements configured to receive said data signal and said control signal and generate a plurality of output signals representative of said shaped pulse, and
a digital to analog converter adapted to receive said plurality of output signals and generate a shaped pulse;
wherein the control signal is determined by interpretation of the shaped pulse as applied to the load, the interpretation comprising determination of the efficiency of the shaped pulse as applied to the load.

14. The circuit of claim 13, wherein the digital to analog converter is adapted to operate at a speed of at least three samples per width of the desired shaped pulse duration.

15. The circuit of claim 13, wherein the output of the digital to analog converter is adapted to connect to any one of
an amplifier;
a hard drive disc;
a device under test;
a radar antenna; or
a transmission device.

16. A method of configuring a circuit to generate a shaped pulse from a data signal comprising:
adapting an input to receive a data signal,
adapting an input to receive a control signal,
configuring a plurality of logic elements to receive said data signal and said control signal and generate a plurality of output signals representative of said shaped pulse, and
adapting a digital to analog converter to receive the plurality of output signals and generate a shaped pulse;
wherein said logic elements comprise a plurality of delay elements, a plurality of switchable connectors and a plurality of flip flops, and the delay elements are configured to receive a clock signal from said clock input where each delay element is adapted to provide, as an output, a secondary clock signal each delayed, by a differing amount, from the clock signal.

17. The method of claim 16, further comprising receiving a clock signal, said a digital to analog converter generating a shaped pulse when a clock signal is received.

18. The method of claim 16, wherein the secondary clock signals are received by said plurality of switchable connectors, said control input is adapted to configure said switchable connectors to selectively connect said secondary clocking signals to said flip flips.

19. The method of claim 16, wherein the control signal is representative of a list of parameters, and the control signal is representative of at least three pulse amplitudes for at least three steps within the duration of the shaped pulse, and the control signal is representative of desired knee points of the shaped pulse.

20. The method of claim 16, wherein the control signal is determined by interpretation of the shaped pulse as applied to the load, the interpretation comprising determination of the efficiency of the shaped pulse as applied to the load.

\* \* \* \* \*